United States Patent [19]

Quella et al.

[11] Patent Number: 4,925,772
[45] Date of Patent: May 15, 1990

[54] ANTI-RADIATION COVERING FOR ELECTRONIC COMPONENTS

[75] Inventors: Ferdinand Quella, Neubiberg; Oskar Nuyken, Munich; Klaus Budde, Unterhaching; Thomas Suefke, Munich, all of Fed. Rep. of Germany

[73] Assignee: Siemens Aktiengesellschaft, Berlin and Munich

[21] Appl. No.: 267,179

[22] Filed: Nov. 4, 1988

[30] Foreign Application Priority Data

Nov. 26, 1987 [DE] Fed. Rep. of Germany ....... 3740168

[51] Int. Cl.$^5$ .......................... G03C 1/70; C07F 9/65; C08F 2/48
[52] U.S. Cl. ..................................... 430/281; 430/270; 430/287; 430/288; 430/325; 522/115; 522/171; 528/168; 528/399
[58] Field of Search ................ 522/115, 171; 528/399, 528/168; 430/281, 270, 325, 280, 288, 287

[56] References Cited

U.S. PATENT DOCUMENTS

| | | | |
|---|---|---|---|
| 3,711,389 | 1/1973 | Hook et al. | 522/115 |
| 4,221,904 | 9/1980 | Hergenrother et al. | 528/363 |
| 4,242,491 | 12/1980 | Hergenrother et al. | 528/168 |
| 4,855,389 | 8/1989 | Ueyama et al. | 528/168 |

FOREIGN PATENT DOCUMENTS 0269021 6/1988 European Pat. Off. .
3708051 9/1987 Fed. Rep. of Germany .

OTHER PUBLICATIONS

Chemical Abstracts, vol. 108(4): 23482w; Nishikawa et al.; May 20, 1987.
Chemical Abstracts, vol. 106(12): 85893y; Yokoyama; Jun. 7, 1986.
Russian Chemical Reviews, Oligomeric Alkoxyphosphazens.
Patent Abstracts of Japan, vol. 10, No. 133 (E-404) [2190] May 17, 1986.
Hans-Georg Elias, "New Commercial Polymers 1969-1975".
V. V. Kireev et al., "Oligomeric Alkoxyphosphazens", Russian Chemical Reviews, vol. 50 (1981), Dec., No. 12, pp. 1186-1200.
Japanese Patent Abstract, vol. 10, No. 133, May 17, 1986.

*Primary Examiner*—Paul R. Michl
*Assistant Examiner*—Christopher D. RoDee
*Attorney, Agent, or Firm*—Hill, Van Santen, Steadman & Simpson

[57] ABSTRACT

A cover layer for micro-electronic components and VLSI circuits is provided for protecting the components and circuits against alpha radiation. The cover layer is produced by ultraviolet cross linking of a negative resist, wherein, as a constituent for absorbing the alpha rays, the negative resist contains a substituted triphosphazene of the formula (I) whose organic radicals are bonded to phosphorus via oxygen and wherein, on a statistical average, 1 through 3 radicals have cross-linkable, light-sensitive groups. The cover layer provided good protection from alpha rays, has low shrinkage during curing and, given high thermal resistance, can be combined when mixing with other negative resists.

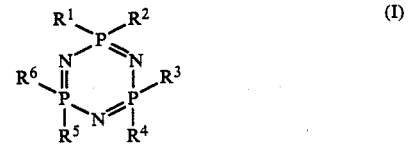

14 Claims, No Drawings

ANTI-RADIATION COVERING FOR ELECTRONIC COMPONENTS

BACKGROUND OF THE INVENTION

The present invention is directed to a cover layer for micro-electronic components and VLSI circuits. In particular, the present invention is directed to a cover layer having a high absorbency for alpha radiation.

As VLSI circuits are becoming increasingly miniaturized, not only does the geometry decrease, but, the electrical values such as, for example, the capacitance of a memory cell, constructed as a capacitor, are reduced to a minimum value. The circuits thereby become increasingly susceptible to external disturbances such as, for example, radioactive emission. In particular, highly ionizing alpha radiation can erase or cause the falsification of data stored as charges in circuits containing memory cells.

To protect the circuits against alpha radiation "from the inside", the circuits are constructed from high purity initial materials that exhibit only a minimum amount of radioactive elements or, respectively, isotope contaminants. To protect the circuits against "external radiation", the circuits have anti-radiation protective layers. These layers typically consist of photo-cross-linkable polyimide lacquers. A layer thickness of about 30 micrometers is sufficient to provide reliable protection of the circuit against alpha rays.

Typical anti-radiation layers, however, exhibit various disadvantages. In a method for applying these layers, the "raw", uncross-linked polyimide resin is applied surface-wide on a wafer containing the circuit. The resin layer is then cross-linked with ultraviolet light in the regions over the circuits, but only over the latter chips. Subsequently these regions are developed. After stripping the unexposed regions, the remaining polyimide layer is after-cured in a multi-hour temperature treatment up to about 250° C. The polyimide layers shrink during this tempering process, resulting in a layer that is only up to 50% that of the original volume. This shrinkage causes the circuit lying below these layers to become mechanically stressed and can thereby damage or even destroy the circuit.

SUMMARY OF THE INVENTION

The present invention provides a cover layer for microelectronic components that is highly heat-resistant and provides protection against alpha rays. The cover layer can be applied in a simple and fast method and does not exhibit any shrinkage during curing.

To this end, the present invention provides a cover layer for micro-electronic components that is created by an ultraviolet-initiated cross-linking of a negative resist layer. The negative resist contains, to ensure the absorption of alpha radiation, a phosphazene derived from the general structure (I) set forth below:

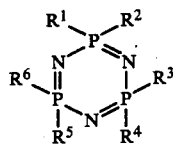

The radicals R1 through R6 are bonded to the phosphorus via a respective oxygen atom. The radicals R1 through R6, independently of one another, are alkyloxy, aryloxy, alkylcarbonyloxy or arylcarbonyloxy groups. These groups can be arbitrarily substituted, as long as at least one of the radicals R1 through R6 carries one light-sensitive group capable of polymerization, on a statistical average. Two or more such groups, allow the monomer to be utilized as a cross-linker.

In an embodiment of the present invention, the radicals carrying the light-sensitive groups are substituted acrylate groups. In a preferred embodiment, the light-sensitive groups are chosen from the group consisting of cinnamic acid and furane acrylic acid.

In an embodiment of the present invention, on a statistical average, radicals having 1 through 3 light-sensitive groups are bonded to the phosphazene and the remaining radicals are phenolate groups.

In an embodiment of the present invention, two respective radicals are bonded to a phosphorus atom of the phosphazene, and together with the respective phosphorus atom, form (n+4)-member heterocycles having the general structure:

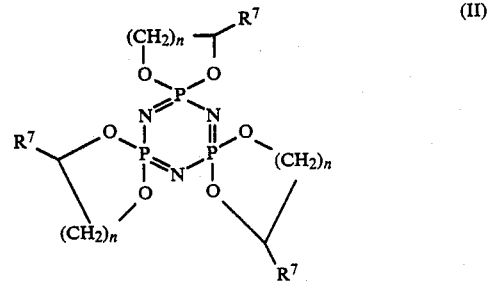

wherein n is a whole number such that $1 \leq n \leq 3$ and R7 carries the light-sensitive group.

In an embodiment of the present invention, the negative resist contains other ultraviolet-cross-linkable polymers in addition to the phosphazene. In a preferred embodiment, the other polymers are derived from epoxy resins that are obtainable by reaction of bisphenols and epichlorhydrine (araldite type polymer).

In an embodiment of the present invention, the radicals R1 through R6 of the phosphazene I are allylalcoholates derived from allyl alcohol and from benzyl alcohol, wherein the ratio of olefinic radicals (allyl alcohol) to saturated radicals is set at between 1:3 and 1:6.

Additional advantages and features of the present invention are described in, and will be apparent from, the detailed description of the presently preferred embodiments.

DETAILED DESCRIPTION OF THE PRESENTLY PREFERRED EMBODIMENTS

The present invention provides a cover layer for microelectronic components and VLSI circuits that have a high absorbency for alpha radiation.

Organopolyphosphazenes are derived from hexachlorotriphosphazene known as "inorganic rubber", and enjoy versatility as elastomers and homopolymers and copolymers. For example, the book "New Commercial Polymers" by H. G. Elias, pages 164 through 169 (London 1977) discusses the properties of fluoroalkylpolyphosphazenes.

The present invention takes the phosphazenes and suitably substitutes these phosphazenes, to link them with light-sensitive groups, and utilizes them in negative resist as an anti-radiation constituent. The radiation protection afforded this new product results from the atomic masses of the elements from which the polymer is constructed. The atomic masses of the elements are high in comparison to others usually contained in, light-sensitive polymers, particularly phosphorus.

To manufacture an employable negative resist, the phosphazenes of the present invention are mixed with photoinitiators, potentially cross-linking promotors, and other standard additives. The resultant finished resist is applied surface-wide to a wafer containing integrated circuits. The resist can be applied, for example, by centrifugal application. The resist is then dried, structured with ultraviolet light or, cross-linked and, finally, developed. No further curing (hardening) of the cross-linked resist structure is necessary.

As a result of the high degree of cross linking, the cross-linked resist exhibits noteworthy thermal stability. Furthermore, only a slight amount of shrinkage occurs during the curing of the resist layers due to the low ratio of the light sensitive groups in (uncross-linked) phosphazenes to the molecule size of the phosphazene. It has been found that adequate protection against alpha radiation can be achieved with a layer thickness of approximately 15 micrometers to about 30 micrometers.

Preferably, cinnamic acid, furane acrylic acid, and similar acids are utilized as the light-sensitive groups of the selected acrylic acids. These acids can be directly esterified with the hexachlortriphosphazene utilized as an initial material. An adequately good light sensitivity and, consequently an adequately high cross-linking rate of the negative resist is achieved with these acids. Other suitable acids include acrylic, methacrylic acid, or derivatives of the compounds.

The number of light-sensitive groups per phosphazene should not be excessively high. If the ratio of light-sensitive groups per phosphazene molecule is too high, the products tend to self-cross-link. Preferably, radicals having one through three light-sensitive groups, on a statistical average, per phosphazene ring are utilized. Advantageously, the remaining radicals are phenolate groups.

A conversion of the hexachlortriphosphazene with a mixture of light-sensitive and non-light-sensitive alcohols allows a phosphazene having the formula (I) set forth below to be obtained.

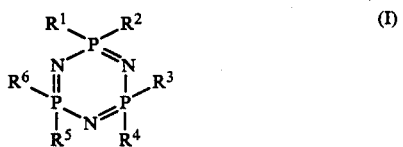
(I)

The light-sensitivity and cross linkability of the phosphazene (I) can be set via the alcoholate mixing ratio. Mixtures of sodium alcoholates of allyl and benzyl alcohol in a mol ratio of 1:3 through 1:6, for example, are suitable.

The present invention provides a structure that avoids self-cross linking because the two radicals that are bonded to the same phosphorus atom form an (n+4)-member heterocycle together with the phosphorus atom. This structure represents the modification (II) that follows the general phosphazene structure (I):

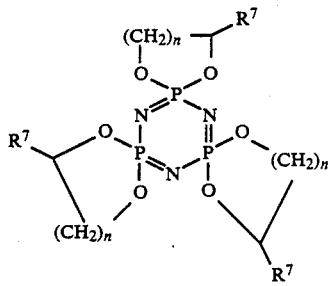
(II)

In the structure, n represents a whole number such that $1 \leq n \leq 3$. The radical $R^7$ carries a light sensitive group which is selected from the aforementioned compounds. Due to the phosphorus atoms that are substituted with binary radicals, every phosphorus ring carries exactly three identical radicals $R^7$ having light sensitive groups, which noticeably reduce the risk of self cross linking.

Further structural improvements of the cover layer of the present invention can be achieved by the admixture of further ultraviolet curable resist materials. Suitable resist mixtures selected for this purpose, which inherently exhibit good dielectric and thermic properties, can be transferred to mixtures having phosphazenes and combined with their anti-alpha radiation effect.

The chemical nature of the radicals $R1$ through $R7$ at the phosphazene is determinative of the selection of suitable resists, particularly, the nature of the light sensitive group. When, for example, the light-sensitive group is an ester of cinnamic acid, furane acrylic acid, or one of its derivatives, then the most suitable resist admixture likewise includes these groups. A useable combination for the layer is achieved particularly from the addition of polymers of the araldite type that are obtained by the reaction of bisphenols with epichlorhydrine and subsequent esterification with light-sensitive acrylic acids as disclosed by German patent application P 37 08 057.1.

However, combinations with other resists are possible insofar as a chemical affinity to the light sensitive radicals R is achieved. Thus, the phosphazene can both represent the largest constituent of the resist mixture in terms of amount, or can be contained therein only in a slight proportion. The variable plurality of light sensitive groups bonded to the phosphazene ring also enables the utilization as a reactive dilutant in ultraviolet curable formulations, whereby the degree of cross-linking of such a mixture can be influenced and thermic and mechanical properties of the cover layer can be improved.

The manufacture of a phosphazene, preferably employed as the cover layer of the present invention, shall now be set forth in greater detail below with reference to a schematic formula and the corresponding rules of synthesis.

Proceeding from 1,3-dioxolane-protected glycerine (III), a corresponding ester (IV) is obtained with cinnamic acid chloride. The acetone protective group is then fractioned off. An ester (V) is obtained. The ester (V) is converted with hexachlorophosphazene to form phosphazene (VI) that is set in a light sensitive manner.

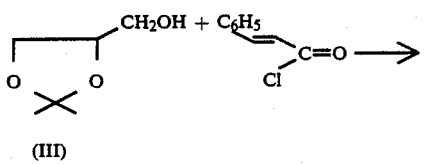

(III)

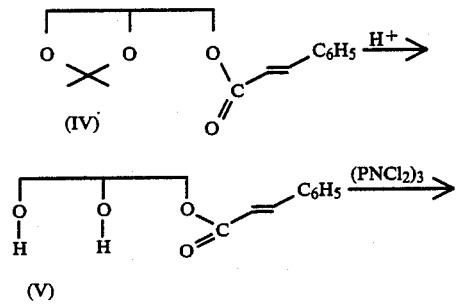

(IV)

(V)

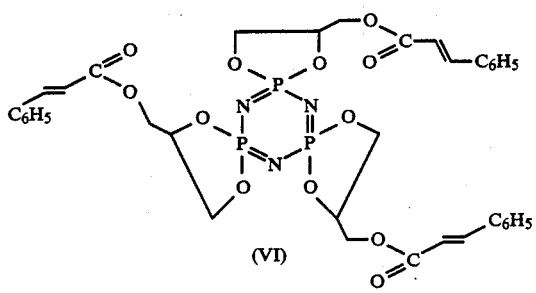

(VI)

The synthesis of phosphazene (VI) proceeds in the following manner. A corresponding quantity of cinnamic acid chloride is dropped into absolute toluol to equimolar quantities of 2,2-dimethyl-4-hydroxymethol-1,3 dioxolane (III) and dry pyridine in absolute toluol at 0° C. while being cooled. The resultant mixture is stirred for several hours and allowed to slowly reach room temperature. The resultant product is then worked in a standard manner to ultimately obtain the product (IV). This product can then be chromatographically cleaned via silica gel. This ketal (IV) is saponified at 90° C. with 1N sulfuric acid. The glycerine-1-cinnamic acid ester (V) is then obtained after standard processing.

At a temperature of −15° C., the ester (V) is converted with hexachlorotriphosphazene and a base, stirred several hours at room temperature and, finally, processed in a standard way. After washing and drying, a colorless, sticky solid remains that, due to the racemic educt (V) and the spiro structures, is composed of the various diastereoisomers of phosphazene (VI).

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

We claim:

1. A cover layer for micro-electronic components and VLSI circuits having a high absorbency for alpha radiation, wherein the cover layer is produced with an ultraviolet-initiated cross-linking of a negative resist structure, as an essential constituent for absorbing the alpha radiation, the negative resist contains a phosphazene derived from the general structure:

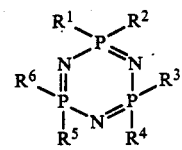

wherein: the radicals R1 through R6 are bonded to the phosphorus via oxygen atoms; on a statistical average, at least one of the radicals R1 through R6 carries a light-sensitive group capable of polymerization, the remaining radicals R1 through R6, independently of one another, are chosen from the group consisting of alkyloxy, aryloxy, alkylcarbonyloxy or arylcarbonyloxy groups; and the light-sensitive group is a substituted acrylate group.

2. The cover layer of claim 1 wherein the light-sensitive groups are chosen from the group consisting of the ester of cinnamic acid or furane acrylic acid.

3. The cover layer of claim 1 wherein the number of radicals R1 to R6 carrying the light-sensitive group in the statistical average is 1 to 3 whereas the remaining radicals are phenolate groups.

4. The cover layer of claim 1 wherein two of the radicals R1 to R6, which are bonded to the same phosphorus atom together with the respective phosphorus atom constitute a (n+4)-member heterocycle having the general structure

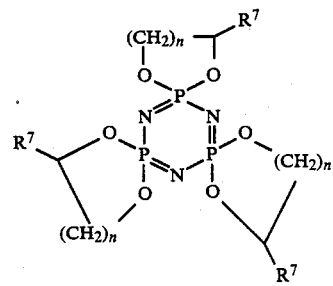

wherein n is a whole number such that $1 \leq n \leq 3$ and R7 carries the light sensitive group.

5. The cover layer of claim 1 wherein the negative resist contains other ultraviolet-cross-linkable polymers in addition to having the phosphazene.

6. The cover layer of claim 5 wherein the other polymers are derived from epoxy resins that are obtainable by reaction of bisphenols and epichlorhydrine (araldite type polymer).

7. A cover layer for micro-electronic components and VLSI circuits having a high absorbency for alpha radiation, wherein the cover layer is produced with an ultraviolet-initiated cross-linking of a negative resist structure, as an essential constituent for absorbing the alpha radiation, the negative resist contains a phosphazene derived from the general structure:

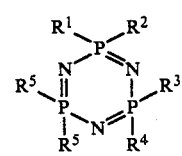

wherein the radicals R1 through R6 are bonded to the phosphorous via oxygen atoms, the radicals R1 through R6 of the phosphazene are allylalcoholates derived from allyl alcohol and from benzyl alcohol, wherein the ratio of the olefinic radicals (allyl alcohol) to saturated radicals is set between 1:3 and 1:6.

8. A negative resist for producing a cover layer for micro-electronic components and VLSI circuits having a high absorbency for alpha radiation, the negative resist containing a phosphazene derived from the general structure:

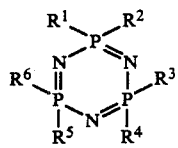

wherein: the radicals R1 through R6 are bonded to the phosphorus via oxygen atoms; at least one of the radicals R1 through R6 carries a light-sensitive group capable of polymerization; the remaining radicals R1 through R6, independently from one another, are chosen from the group consisting of alkyloxy, aryloxy, alkylcarbonyloxy and aryl-carbonyloxy groups; and the light-sensitive group is a substituted acrylate group.

9. The negative resist of claim 8 wherein the light-sensitive groups are chosen from the group consisting of the ester of cinnamic acid or furane acrylic acid.

10. The negative resist of claim 8 wherein the number of radicals R1 through R6 carrying the light-sensitive group in the statistical average is 1 to 3 whereas the remaining radicals are phenolate groups.

11. The negative resist of claim 8 wherein two respective radicals bonded to a phosphorus atom of the phosphazene, together with the respective phosphorus atom, form (n+4)-member heterocycles having the general structure:

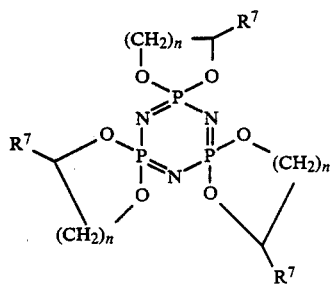

wherein n is a whole number such that $1 \leq n \leq 3$ and R7 carries the light-sensitive group.

12. The negative resist of claim 8 wherein the negative resist contains other ultraviolet-cross-linkable polymers in addition to having the phosphazene.

13. The negative resist of claim 12 wherein the other polymers are derived from epoxy resins that are obtainable by reaction of bisphenols and epichlorhydrine (araldite type polymer).

14. The negative resist of claim 8 wherein a cover layer is produced by an ultraviolet cross-linking of the negative resist.

* * * * *